United States Patent [19]

Samuels et al.

[11] Patent Number: 5,862,058

[45] Date of Patent: Jan. 19, 1999

[54] OPTICAL PROXIMITY CORRECTION METHOD AND SYSTEM

[75] Inventors: Donald James Samuels, Yorktown Heights; Matthew R. Wordeman, Mahopac, both of N.Y.

[73] Assignee: International Business Machines Corporation, Armonk, N.Y.

[21] Appl. No.: 648,745

[22] Filed: May 16, 1996

[51] Int. Cl.$^6$ .............................. G06F 17/50; G06K 9/03
[52] U.S. Cl. ........................... 364/491; 364/878; 378/34; 378/35; 250/492.2; 382/144; 382/145; 382/151
[58] Field of Search .................................. 364/488–491, 364/578; 359/241, 572; 356/355, 237, 357; 427/8; 250/492.1–492.3, 548, 281, 396 R, 397–400, 306–307; 382/141, 144–151; 430/30; 378/34–35

[56] References Cited

U.S. PATENT DOCUMENTS

| | | | |
|---|---|---|---|
| 4,408,884 | 10/1983 | Kleinknecht et al. | 356/355 |
| 4,703,434 | 10/1987 | Brunner | 364/488 |
| 4,835,704 | 5/1989 | Eichelberger et al. | 364/490 |
| 4,895,780 | 1/1990 | Nissan-Cohen et al. | 430/5 |
| 5,097,138 | 3/1992 | Wakabayashi et al. | 250/492.2 |
| 5,182,718 | 1/1993 | Harafuji et al. | 364/490 |
| 5,208,124 | 5/1993 | Sporon-Fiedler et al. | 364/468 |
| 5,585,211 | 12/1996 | Firstein et al. | 430/30 |
| 5,631,731 | 5/1997 | Sogard | 256/121 |
| 5,663,893 | 9/1997 | Wampler et al. | 364/491 |

FOREIGN PATENT DOCUMENTS

| | | | |
|---|---|---|---|
| 0 529971A1 | 8/1992 | European Pat. Off. | G03F 7/20 |
| 0 529 971 A1 | 3/1993 | European Pat. Off. | G03F 1/14 |
| 2-276262 | 1/1991 | Japan | H01L 21/82 |

OTHER PUBLICATIONS

Ouabbou et al. ("Proximity effects in electron beam lithography in SAL 601 resists on Si–SiO sub(2)–Si substrate", Microelectronic Engineering, Jan. 1, 1993, pp. 255–273), Jan. 1, 1993.

Kostelak et al. ("GHOST proximity correction technique: its parameters, limitations and process latitude", Journal of Vacuum Science and technology, Jan. 1988, pp. 448–455), Jan. 1998.

Lee et al. ("Lithography technology development and design rule consideration for 0.4–0.35 mu m DRAM semiconductor processes", IEEE, 31 May 1995, pp. 300–308, May 31, 1995.

Chu et al. ("Fabrication of 50 nm line–and–space x–ray masks in thick Au using a 50 keV electron beam system", Journal of Vacuum Science and Technology, Jan. 1992, pp. 118–121), Jun. 1992.

Ma et al. ("Proximity corrections in a raster scan electron lithography machine", Journal of Vacuum Science and Technology, Nov. 1981, pp. 1275–1278).

Kato et al. ("Proximity effect correction in electron–beam lithography", Journal of Vacuum Science and Technology, Nov. 1981, pp. 1279–1285).

Hubner (Strategy for the correction of the proximity effect in electron beam lithography:, Microelectronic Engineering, Jan. 11, 1992, pp. 275–293).

Van den Hove et al. ("Optical lithography techniques for 0.25 mu m and below: CD control issues", IEEE, May 31, 1995, pp. 24–30).

*Primary Examiner*—Kevin J. Teska
*Assistant Examiner*—Phallaka Kik
*Attorney, Agent, or Firm*—Schmeiser, Olsen & Watts; Eric W. Petraske

[57] ABSTRACT

An optical proximity correction method and system are disclosed that allows for the correction of line width deviations caused by nonlinear lithography tools by calculating required chrome on glass line widths for a desired printed line. Line width correction is determined based only on the pitch of the line, defined as the width of the line and the distance to an adjacent line. Correction information is calculated from an aerial simulation and is then organized by pitch to provide a more efficient means of line correction.

22 Claims, 4 Drawing Sheets

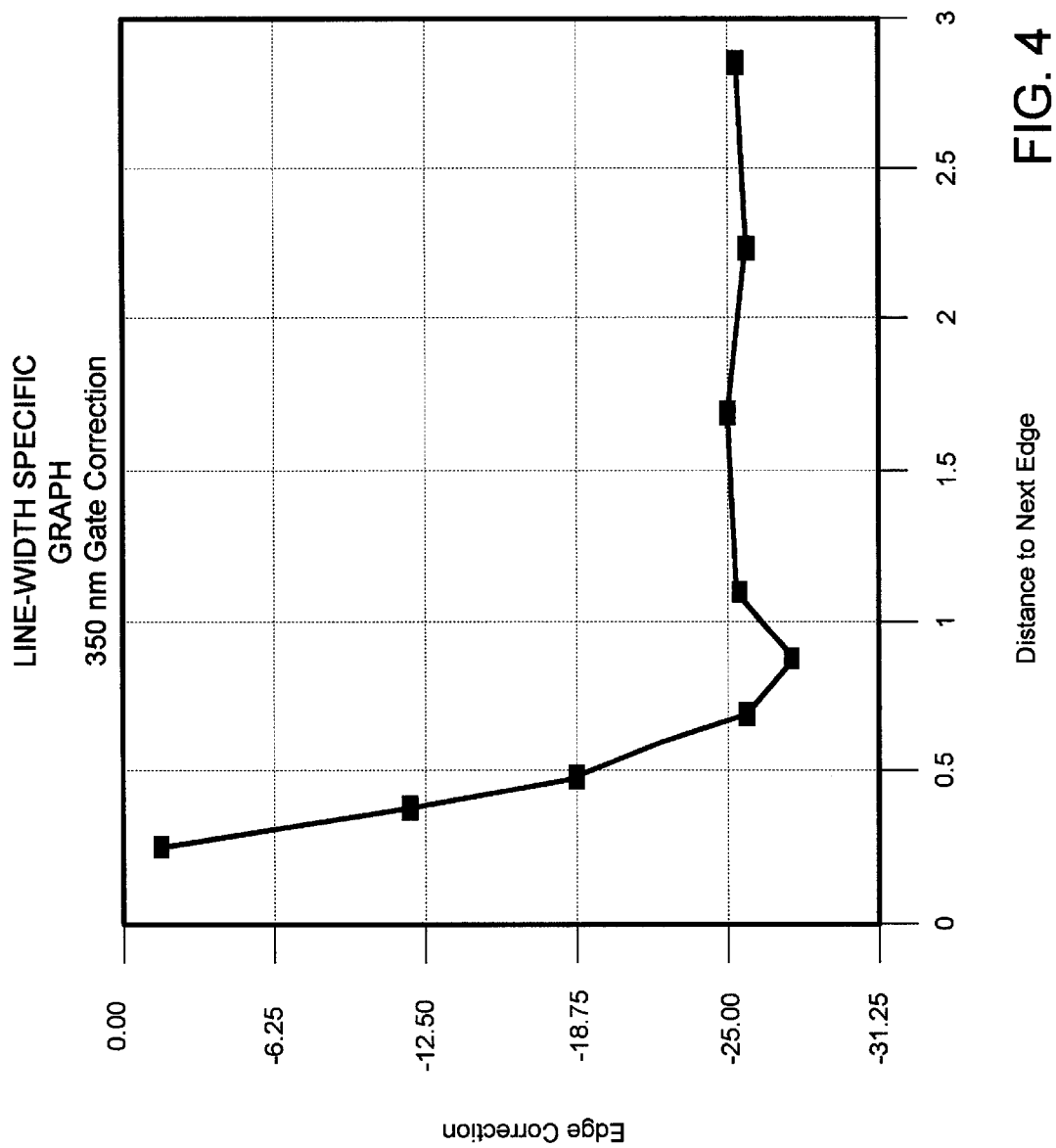

OPTICAL PROXIMITY CORRECTION METHOD AND SYSTEM

BACKGROUND OF THE INVENTION

1. Technical Field

The present invention relates to optical lithography systems. More particularly, this invention relates to a method and system for correcting line width deviations.

2. Background Art

Since the beginning of the computer era, manufacturers in the field of integrated circuits (IC's) have sought to reduce the geometric size of the devices (e.g., transistors or polygates) present on integrated circuits. The benefits achieved in reducing device dimensions include higher performance and smaller packaging sizes. However, numerous limitations arise as manufacturers attempt to achieve smaller and smaller device sizes. One primary problem manufacturers face is that as smaller devices are sought, the precision required from the tools used to create IC devices increases beyond their capabilities. Given the prohibitive costs involved and potential time lost to wait for the next generation of tools, manufacturers are forced to find techniques and methods that will allow such tools to operate beyond their intended specifications.

One of the first steps in manufacturing integrated circuit chips involves the laying out or designing of the circuits to be packaged on a chip. Most integrated circuits are designed using computer aided design (CAD) layout tools. CAD tools allow chip manufactures to plan the layout of the circuits on a computer where they can be analyzed and stored. Once this step is finished, the designs need to be transferred onto the chip. Unfortunately, present day chip manufacturing tools often lack the capability to create increasingly complicated and compact integrated circuit chips.

The predominate method of creating devices on integrated circuit chips involves the use of masks. In general, masks typically comprise a transparent substrate on which various "circuit" patterns, determined by a CAD system, are disposed. That "circuit" pattern is then transferred onto the surface of a silicon wafer. The transfer of the pattern from the mask to the silicon substrate is accomplished by passing visible, ultraviolet, or even x-ray radiation (e.g., light) through the mask and onto a silicon substrate containing a photoresist material. Because the mask contains a pattern made up of solid lines and clear space, only those areas made up of clear space will allow radiation to pass. This process results in the creation of devices on the silicon substrate. This methodology is referred to as photolithography.

A popular method of creating mask patterns involves the use of chrome and is often referred to as chrome on glass (COG). It is recognized however that the methods and systems described herein are equally applicable to all masks that involve light blocking materials and/or attenuated mask systems. In attenuated mask devices, such as attenuated phase shifters and alternating phase shifters, the chrome or other light blocking material is replaced with an attenuating material that allows a small amount of light (e.g., 6%) to pass through and get phase shifted. The materials may include silicon nitride, carbon, thin chrome with an oxide, thin chrome with the clear areas etched, etc.

Unfortunately, the efficacy of all lithography tools is limited by numerous factors, and is especially limited by the resolution of the lens used to direct the radiation through the mask. When a system is being used within its resolution limits, an aerial image of the circuit will be printed onto the chip as desired (i.e., "on size"). However, when the tool is being used aggressively, that is, past the design limits of the tool, certain images will print with a deviation from their desired size. This is referred to as operating in a nonlinear regime. Thus, under certain circumstances, it is not unusual to have polygates deviate from their desired size by as much as 50 nanometers (nm), which is unacceptably high.

Lens resolution is a function of several factors that make up the "exposure system" and is typically expressed as:

$$r = \frac{k_1 \lambda}{Na}$$

where r is the resolution desired, $\lambda$ is the exposing wavelength, and Na is the numerical aperture of the lithography tool. For many of today's applications, the lithography tool is being used aggressively, usually past the design limits of the tool, when $k_1$ is below 0.8. As noted, aggressive use of the tool is driven by the desire to create smaller and smaller devices.

When the tool is being used beyond its design limits, a specific line/space combination or "control grating" may be chosen to print on size and the tool is calibrated accordingly. However, because the tool is operating in a nonlinear manner, the other lines will print with a deviation from their desired size. Thus, without taking some further corrective measure, it is impossible to achieve a complete circuit pattern without significant line deviation.

There have been numerous attempts at solving this problem including those involving proximity corrections. Proximity correction methods work by modifying the dimensions of the chrome lines on the mask to compensate for the error caused by nonlinear operation. Thus, under this technique, it may be necessary to put a chrome line with a width of 0.95 microns on the mask to print a line with a width of 1.0 microns. However, because a given mask may contain millions of lines of varying dimensions, difficulties arise in providing an efficient and accurate method for calculating line modifications.

There exist several vendors who provide various product solutions utilizing proximity correction methods. One such product is FAIM, which requires the running of an aerial image simulation of the entire chip, determining the deviation of each line, and then correcting for each deviation. An aerial image (AI) simulation is a known method of using a computer system to generate predicted printed line deviations based upon various parameters, including the type of lithography tool. The methodology of correcting for each deviation under such systems typically involves adjusting the original chrome-on-glass data by the opposite amount of the aerial image deviation. For instance, if the AI shows an undesired edge movement of +100 nm, then the system would compensate by changing the input shape by −100 nm. Unfortunately, the input shape with the adjustment may have a different deviation than the original shape showed, so this technique would have to undergo an iterative process until the desired AI is achieved. Moreover, there is no guarantee of convergence. The result is that the run time to perform this operation can be prohibitively long.

Another product, PRECIM, requires the printing of a wafer with a predetermined pattern, measuring the pattern, and then running the results through a software package to come up with a set of convolution functions which can then be applied to the design data. Yet another vendor, Trans Vector Technologies, utilizes a rules-based system derived from the lithographic exposure system being used. Their system utilizes the width of the line, the distance to the nearest line, and the width of the nearest line.

In addition, various patents exist that address the same issue. For example, U.S. Pat. No. 5,208,124, entitled "Method of Making a Mask for Proximity Effect Correction in Projection Lithography," issued on May 4, 1993, to Sporon-Fiedler et al. teaches a method of adjusting line sizes on the glass mask based on a series of equations. Unfortunately, these equations are generic to all exposure systems and desired patterns and, therefore, fail to provide accurate line width corrections for all possible cases.

While these and numerous other techniques exist for line proximity correction techniques, none exist that take into account for the particular exposure system and circuit type being designed, and require only information regarding line width and line spacing. Thus, a need exists to provide an accurate and precise proximity correction technique for performing line width corrections during an optical lithography operation. The aforementioned art is herein incorporated by reference.

DISCLOSURE OF INVENTION

Disclosed is a system and method of correcting line element deviations caused during the nonlinear operation of an optical lithography system. The system and method utilize aerial simulation information to calculate adjusted or modified chrome line widths required to print a desired line pattern. With the simulation data, the system and method generate expected line deviation information for a predetermined exposure system and circuit type. A control grating (i.e., a line/space combination known to print on size) can then be determined consisting of a control line width and a control clear space width. From the expected deviation information, line correction information can be calculated and grouped into subsets of pitch specific line correction information. With the pitch specific line correction information, a CAD system or the like can calculate line width corrections based on line pitch. Thus, under this system and method, modified chrome on glass line/space patterns can be readily calculated and placed onto an optical mask to overcome nonlinear line deviations.

It is therefore an advantage of the present invention to provide a CAD layout tool with a line width correction system capable of overcoming non-linearities caused by a lithography tool.

It is a further advantage of the present invention to be able to calculate required chrome on glass line widths for a desired printed line using only pitch information.

It is a further advantage of the present invention to provide a time efficient means of performing line correction calculations.

It is a further advantage of the present invention to provide an accurate means of performing line correction calculations.

The foregoing and other objects, features and advantages of the invention will be apparent from the following more particular description of the preferred embodiment(s) of the invention, as illustrated in the accompanying drawing(s).

BRIEF DESCRIPTION OF DRAWINGS

The preferred exemplary embodiment of the present invention will hereinafter be described in conjunction with the appended drawings, where like designations denote like elements, and:

FIG. 4 depicts a line-width specific graph for a 350 nm gate correction in accordance with a preferred embodiment of the present invention.

BEST MODE FOR CARRYING OUT THE INVENTION

Figure 1:
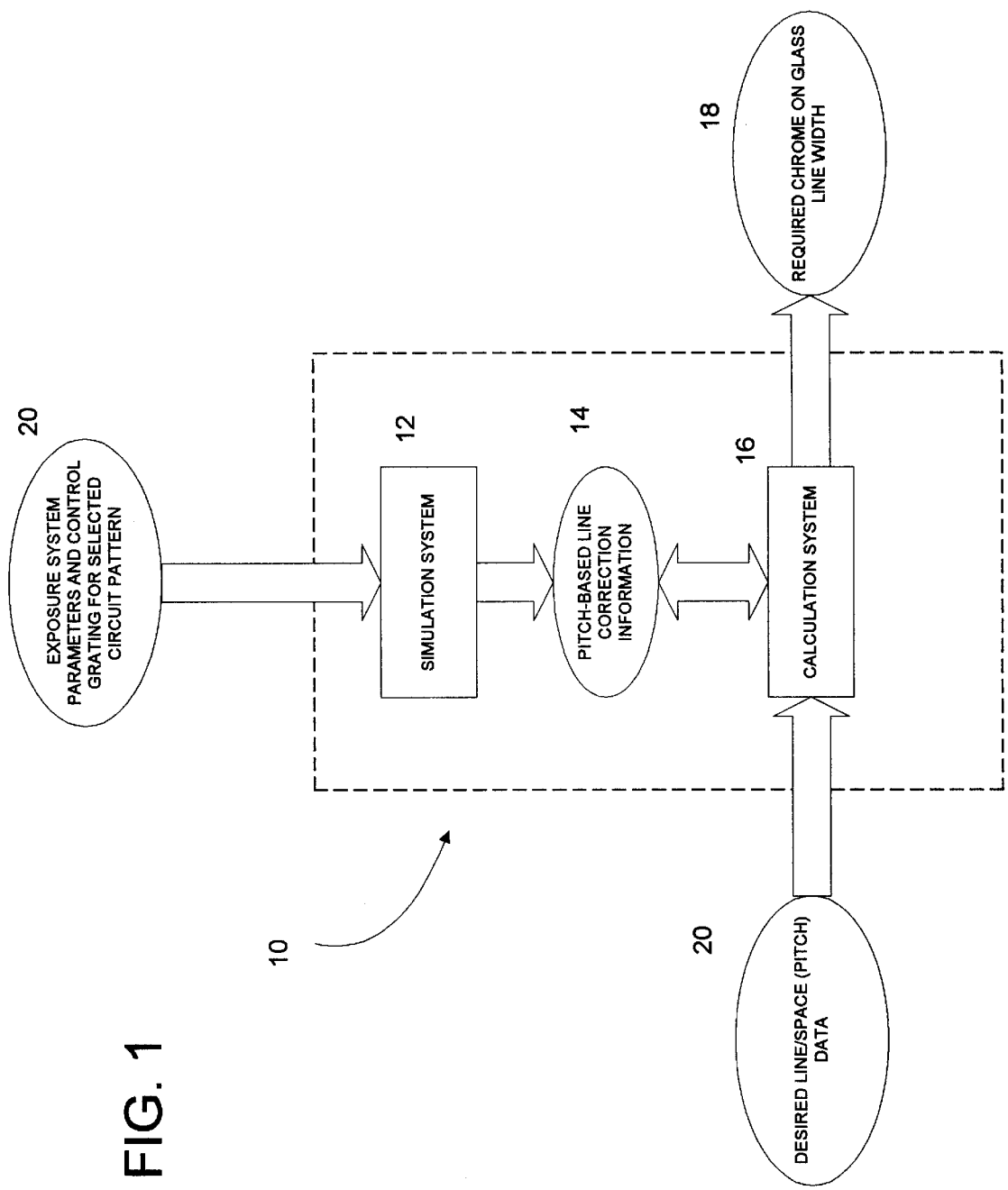
FIG. 1 depicts a block diagram of a line width correction system in accordance with a preferred embodiment of the present invention.

Referring now to the drawings, FIG. 1 depicts an optical proximity correction system in accordance with a preferred embodiment of this invention. As discussed above, the system 10 allows for the correction of lithography tool errors that occur when the tool is operating in a nonlinear capacity. The system 10 comprises a simulation system 12 and a calculation system 16. The simulation system 12 uses simulated data to predict the print error for a plurality of line/space gratings, and then provides correction information 14. (Each line/space grating consists of two components, a line width and a distance to an adjacent line. The sum of these two components is referred to as the "pitch.") The calculation system 16 examines actual line/space combinations that exist within a desired circuit layout and then calculates modified line dimensions 18 by referring to the correction information 14. The advantage of this system over known systems is that a line modification can be determined by knowing only the width of the line and the distance to an adjacent line.

The simulation system 12 operates by first reading an input 20 that consists of exposure system parameters and a control grating for a selected circuit pattern. Exposure system parameters will include such factors as the wavelength and the numerical aperture of the lithography tool. The control grating will generally be defined as the minimum line/space dimension for all of the lines to be printed in the selected circuit. Once the control grating is chosen, the lithography tool can be calibrated such that the control grating will print "on size," while other line/space combinations will be printed with some error.

Although this disclosure concentrates on chrome on glass as the preferred type of mask, it is recognized that the systems and methods described herein apply to all light blocking materials, including light attenuating materials. It is likewise noted that the mask type makes up part of the definition of the lithography tool parameter set.

Based on input 20, the simulation system 12 will run a series of aerial image simulations on infinite line/space gratings of varying dimensions ranging from the minimum dimension (control grating) up to a region where the lithography tool is operating in a linear manner. The intensity threshold to measure the simulated line widths is chosen to be the same structure the process line uses when dispositioning wafers. The output of the simulation system consists of correction information 14. This information may be in the form of a graph, a table, a polynomial equation or the like. The correction information 14 will provide data regarding how to achieve a printed line width size by varying the "chrome on glass" line size. The correction information 14 will be accessible by a calculation system 16. The calculation system 16 can then read in line/space (i.e., pitch) information 20 and output a modified line width 18. Thus, by supplying the desired "printed" pitch dimensions, the correction system 10 can generate a required chrome on glass line width to achieve the desired printed line width. As noted, a distinct advantage of this system is that only pitch information (i.e., line width and distance to adjacent line) is required to determine a modified line width 18. The key to this system 10 is that the simulation system is adapted to generate pitch-based line modification data rather than some other type of data that requires more than just line pitch information to determine a modified line width.

Figure 2:
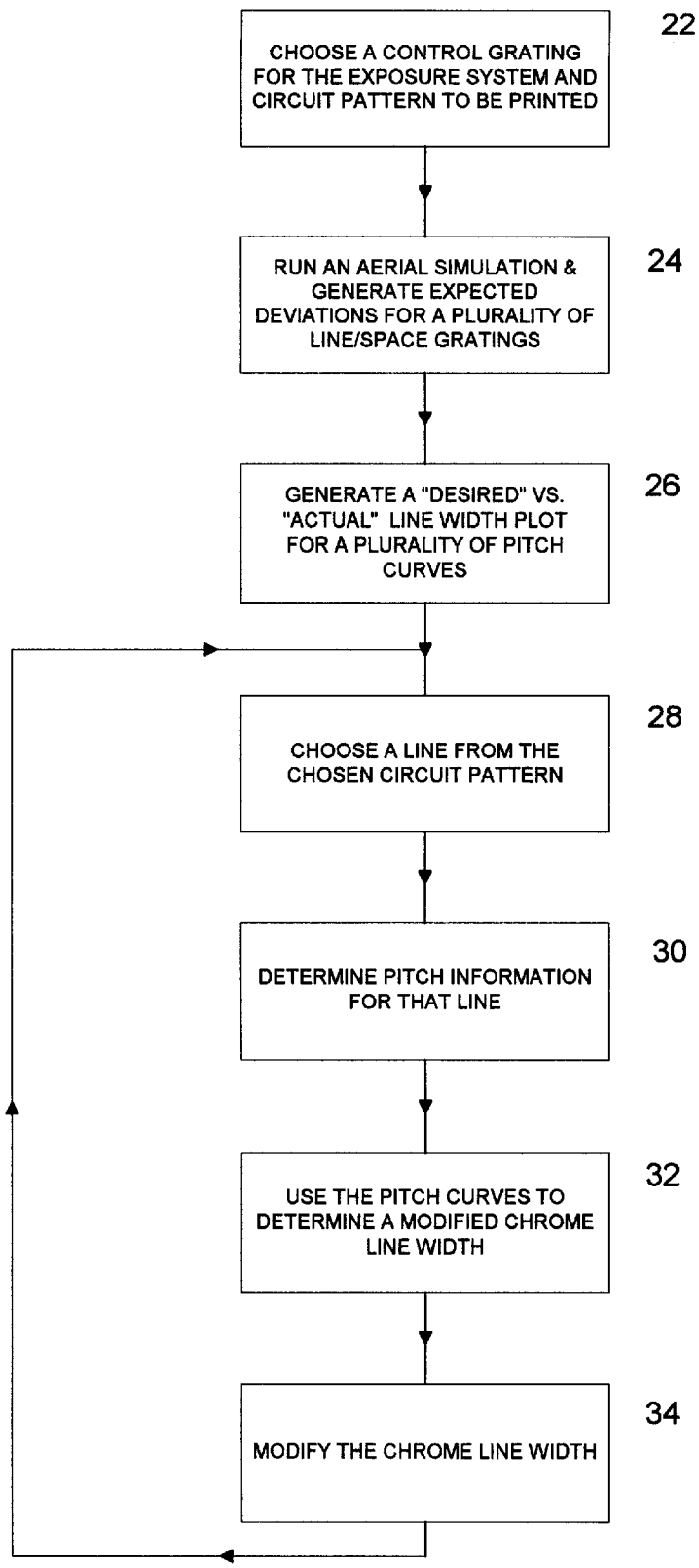
FIG. 2 depicts a flow diagram of a line width correction method in accordance with a preferred embodiment of the present invention.

Referring now to FIG. 2, a proximity correction method is depicted in block diagram form. The first step 22, is to choose a control grating for an exposure system and circuit pattern to be printed. For example, for a straight gate pattern, a chrome line of 0.30 microns and a clear space of 0.25 microns would be required. As noted above, the exposure system parameters would include factors such as wavelength and the numerical aperture of the lithography tool. Next, an aerial simulation would be performed to generate expected deviations for a plurality of line/space gratings 24. An aerial simulation functions by examining the system parameters to predict the nonlinear effects of the system. Once this is done, the expected deviations for a particular line/space combination can be readily determined. That information can then be transformed into correction information that provides "required" versus "desired" line width information. One possible format for this information is a plot that depicts a plurality of pitch curves 26. In other words, for a given pitch (e.g., 0.55 microns), a curve can be generated that provides a desired or simulated image versus the actual or required chrome on glass image. This will be explained in further detail with regard to FIG. 3. As noted above, other types of correction information, such as tables or equations, could be used.

Next, a line is chosen from the circuit pattern 28. Pitch information regarding that line is then calculated 30. This information will include the width of the chosen line and the distance to an adjacent line. A modified chrome line width can then be determined using the pitch curves calculated above 32. Finally, the chrome line width can be modified to produce the necessary printed image 34. The system can then repeat the final steps 28, 30, 32 and 34 until all of the lines on a mask have been examined and modified where necessary.

Figure 3:
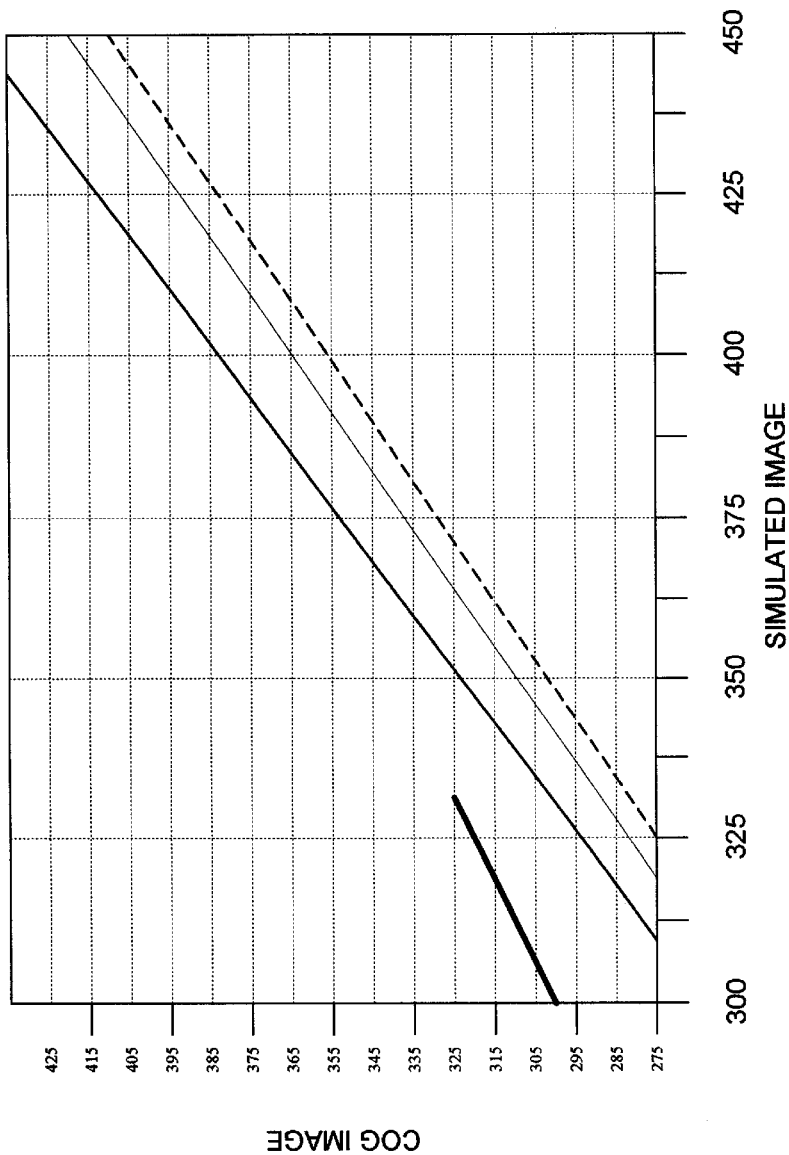
FIG. 3 depicts a pitch look-up graph in accordance with a preferred embodiment of the present invention.

Referring now to FIG. 3, a sample pitch lookup graph is shown. As discussed above, the pitch lookup graph can be derived from an aerial image simulation using known mathematical principles. The graphs will include a plurality of pitch curves that can be used to determine required chrome on glass images (y axis) for a desired printed or simulated image (x axis). The first step in using this graph would be to determine the pitch, which equals the width of the line plus the distance to an adjacent line. For example, if the desired circuit pattern required that a line be printed with a width of 400 nm and a distance to an adjacent line of 500 nm, it would have a pitch of 900 nm or 0.9 microns. Next, the corresponding "pitch curve" on the graph must be selected, which for this example would be the pitch curve represented by the dashed line. Then, knowing that the desired or simulated image width for the line is 400 nm, the actual or chrome on glass image necessary to print a 400 nm line can be readily ascertained. In this case, it can be seen that for a pitch of 0.9 microns and a desired line width of 400 nm, the chrome on glass width must be about 356 nm. Thus, actual chrome on glass image sizes can be readily calculated simply by knowing the width of the desired printed line and its distance to an adjacent line. The advantage of this system is that adjacent line widths are not required for correcting non-linearities. It is recognized that this lookup graph can also be readily converted into a look-up table or one or more polynomial equations.

In any correction methodology, the pitch (line+space) will be a constant number. If the chrome edge grows out by a certain amount, then the clear space must shrink by the same amount. This is important as it will allow a convergence after only one iteration of simulations. By using the graph of FIG. 3, the X-axis will represent not only the aerial simulation, but also the desired image. By then checking where the pitch crosses the desired aerial image simulation and reading the chrome on glass image off of the Y-axis, one has determined the required chrome on glass image to achieve a desired aerial image.

In actuality, the techniques described herein adjust edges of shapes. Thus, if the shape (e.g., line) is an asymmetric layout, i.e., one side has a distance "a" to the next adjacent shape and the other side has a distance "b" to its next adjacent shape, each edge will be adjusted independently and will have a different correction applied to it. FIG. 4 describes how such calculations are made utilizing the present method and system.

FIG. 4 depicts a line-width specific graph providing "edge correction" information, derived from FIG. 3. This particular graph shown in FIG. 4 is specific to a 350 nm gate correction system. On this graph, edge correction of a particular line can be determined by plugging the distance to the next or adjacent edge for this specific line width. (In this case, 350 nm). Thus, for a distance to next edge of 0.5 microns, the edge of the line must be changed by approximately −18.75 nm. Thus, to achieve a 350 nm line, the chrome on glass image must be reduced by approximately 18.75 nm. The opposite edge of that line can then be evaluated in the same manner to determine its edge correction. Therefore, under this method of correction, each line may have both edges adjusted based upon their respective distances to adjacent lines. Note however that no iterative process is required. In other words, both edge calculations are based upon the same line width (e.g., 350 nm).

The graph shown in FIG. 4 is derived from the graph shown if FIG. 3 as follows. The X-axis of FIG. 4 represents the pitch converted to "distance to next edge" (i.e., pitch −350 nm). The Y-axis was converted from FIG. 3 by the transform: y(FIG. 4)=0.5 * (Y(FIG. 3) −350 nm). The Y-axis is divided by two so that the edge movement, rather then the shape movement, is plotted. Because this is a grating, the edge movement is symmetrical about both edges.

The following discussion provides a methodology for using the proximity correction system for modifying CAD layout data. First, identify the shapes of interest. For example, in correcting the gate conductor layer, the FET gate is a region of interest and can be identified by the intersection of this gate and isolation layers. Next, identify the edges of interest in these shapes. An example in a gate shape would be the edges which are covered by an isolation shape. (Here an edge is meant to be a line segment.) For each edge of interest, determine the center point of the edge. Next, find the width of the shape at this edge by projecting perpendicular to a line parallel to the edge, from the edge center toward the inside of the shape to the nearest edge belonging to the same shape. Then, find the distance to the neighbor by projecting to the same point on the edge, in the opposite direction to the nearest edge belonging to another shape. Finally, use the line width and distance to the neighbor as input to the proximity correction method described above. Then use the results to move the edge.

A second technique is described below. First, identify the shapes and edges of interest as done above. Then, for each edge, break each edge into pieces of fixed length and calculate an average or medium edge movement based on the edge movement predicted for each edge segment. Then, move the entire edge by this amount. Finally, a third technique could be used by applying the same steps as taught in technique two, except move each edge segment separately based on the proximity correction information for that edge segment. Then, connect segments from the same edge that have different displacements by creating a polygonal shape with edge segments connected by new edges at the ends of, and perpendicular to the displacement edge segments.

The foregoing descriptions of the preferred embodiments of the invention have been presented for purposes of illustration and description. It is not intended to be exhaustive or to limit the invention to the precise form disclosed, and obviously many modifications and variations are possible in light of the above teachings. Such modifications and variations that may be apparent to a person skilled in the art are intended to be included within the scope of this invention as defined by the accompanying claims.

We claim:

1. A method of correcting line element deviations during nonlinear operation of an optical lithography system by width adjusting a light blocking material on an optical mask, said method comprising the steps of:

choosing a control grating for a predetermined circuit pattern and exposure system, said control grating represented by a control line and a control clear space width;

generating expected line deviation information from an aerial simulation for a plurality of line/space gratings wherein said plurality of line/space gratings ranges from said control grating to a region where said optical lithography system operates linearly;

generating line correction information from said expected line deviation information wherein said line correction information is grouped into subsets of information, each having a fixed pitch;

for at least one line to be placed on said optical mask, determining a line width and distance to an adjacent line;

for said at least one line to be placed on said optical mask, using said line correction information to determine a modified line width to correct for line element deviation; and for said at least one line to be placed on said optical mask, adjusting the width of each of said at least one line as necessary.

2. The method of claim 1 wherein said lines on said optical mask are chrome lines.

3. The method of claim 1 wherein said lines on said optical mask comprise a light attenuating material.

4. The method of claim 1 wherein said line correction information is comprised of a look-up graph that includes a plurality of pitch curves, said look-up graph having a first axis representing a desired line width and a second axis representing a required light blocking material line width.

5. The method of claim I wherein said line correction information is comprised of at least one look-up table that is categorized by pitch and provides a required light blocking material width for a desired line width.

6. The method of claim I wherein said line correction information is comprised of at least one pitch specific polynomial equation that calculates a required light blocking material width for a desired line width.

7. The method of claim 1 further including the step of generating at least one predetermined line width graph having an edge correction curve wherein said at least one predetermined line width graph has a first axis that represents a distance to an adjacent line and a second axis that represents an edge adjustment value.

8. The method of claim 7 wherein the values on said second axis of said at least one predetermined line width graph are determined by calculating the difference of corresponding points on said second axis of said lookup graph and said desired line width, then dividing by two.

9. A method of generating line width correction information within a computer aided design layout system to correct for printed line deviations caused by the nonlinear operation of an optical lithography system, said method comprising the steps of:

selecting an environment, said environment to include at least one optical lithography system parameter and at least one circuit pattern parameter;

simulating said environment to generate a plurality of predicted line deviation values as a function of corresponding line/space proportions; and transforming said plurality of predicted line deviation values into line width correction information, wherein the line width correction information is categorized by pitch, the pitch including the width of a printed line and a distance to an adjacent printed line.

10. The method of claim 9 wherein said line width correction information includes a means for determining the required size of a light blocking material to achieve a desired line width size.

11. The method of claim 10 wherein said line width correction information appears as at least one pitch curve on a look-up graph.

12. The method of claim 10 wherein said line width correction information is in table format.

13. The method of claim 10 wherein said line width correction information is in polynomial format.

14. The method of claim 9 wherein said light blocking material comprises chrome on glass.

15. The method of claim 9 wherein said light blocking material comprises light attenuating material.

16. A computer aided design integrated circuit layout tool having an optical lithographic line deviation correction system, said system comprising:

a simulation system that generates pitch-based line width correction information for a predetermined exposure system and control grating wherein a pitch includes line width and a distance to an adjacent line; and a calculation system that takes as input a desired line width and a desired distance to an adjacent line and utilizes said pitch-based line width correction information to calculate a required width of a light blocking material.

17. The lithographic line deviation correction system of claim 16 wherein said calculation system includes a look-up graph having a plurality of pitch curves.

18. The lithographic line deviation correction system of claim 16 wherein said calculation system includes a table look-up system for calculating said required width of said light blocking material.

19. The lithographic line deviation correction system of claim 16 wherein said calculation system includes a polynomial algorithm for calculating said required width of said light blocking material.

20. The lithographic line deviation correction system of claim 16 wherein said light blocking material is a chrome on glass material.

21. The lithographic line deviation correction system of claim 16 wherein said light blocking material is a light attenuating material.

22. A method of correcting line element deviations in which line correction information is created for a particular optical lithography system, the method comprising the steps of:

simulating operation of the particular optical lithography system to generate a plurality of predicted line deviation values; and converting the plurality of predicted line deviation values into line width correction information based on a combined element of line width and distance to an adjacent line, whereby accurate line correction information is obtained in a single iteration.

* * * * *